(12) United States Patent
Valenzuela Valdes et al.

(10) Patent No.: US 8,872,080 B2
(45) Date of Patent: Oct. 28, 2014

(54) MULTIPLE INPUT, MULTIPLE OUTPUT ANALYSER

(75) Inventors: Juan Francisco Valenzuela Valdes, Cartagena (ES); David Agapito Sanchez Hernandez, Murcia (ES); Antonio Manuel Martinez Gonzalez, Cartagena (ES); Juan Monzó Cabrera, Cartagena (ES)

(73) Assignee: Emite Ingenieria, Slne, Murcia (ES)

( * ) Notice: Subject to any disclaimer, the term of this patent is extended or adjusted under 35 U.S.C. 154(b) by 494 days.

(21) Appl. No.: 12/737,947

(22) PCT Filed: Sep. 3, 2009

(86) PCT No.: PCT/ES2009/070364
§ 371 (c)(1),
(2), (4) Date: Mar. 3, 2011

(87) PCT Pub. No.: WO2010/026274
PCT Pub. Date: Mar. 11, 2010

(65) Prior Publication Data
US 2011/0155725 A1  Jun. 30, 2011

(30) Foreign Application Priority Data
Sep. 3, 2008 (ES) .................................. 200802584

(51) Int. Cl.
*H05B 6/64* (2006.01)
*H05B 6/72* (2006.01)
*H05B 6/70* (2006.01)
*G01R 29/08* (2006.01)

(52) U.S. Cl.
CPC .............. *G01R 29/0871* (2013.01); *H05B 6/72* (2013.01); *H05B 6/705* (2013.01); *G01R 29/0821* (2013.01)
USPC ........... 219/756; 219/678; 219/679; 219/690; 219/701; 219/713; 219/714; 219/746

(58) Field of Classification Search
CPC ............ H05B 6/705; H05B 6/78; H05B 6/80; G01R 29/0821
USPC ......... 219/713–714, 696, 701, 746, 678–681, 219/690; 324/457, 452
See application file for complete search history.

(56) References Cited

U.S. PATENT DOCUMENTS 2,783,347 A * 2/1957 Warren .......................... 219/775
2,920,174 A * 1/1960 Haagensen ................... 219/685
(Continued)

FOREIGN PATENT DOCUMENTS

EP         69105 A1 *  1/1983  ............... H05B 6/78
ES      2246183 A1     2/2006
(Continued)

OTHER PUBLICATIONS

English language version of International Search Report PCT forms in English and Spanish.

*Primary Examiner* — Dana Ross
*Assistant Examiner* — Brett Spurlock
(74) *Attorney, Agent, or Firm* — Harness, Dickey & Pierce, P.L.C.

(57) ABSTRACT

Example embodiments relate to a multiple inputs and multiple outputs (MIMO) analyzer for an accurate control of electromagnetic fields inside a multimode resonant chamber with two or more cavities coupled in an accurate way through a slotted piece with slots or waveguide. The MIMO analyzer may include broadband antennas, different types of lenses, and different stirrers, which may be both metallic and non-metallic. These elements, together with some processes such as precise location of under-test elements out of the lower cavity allow for controlling the electromagnetic fields on its interior. This control permits the emulation of the behavior of wireless communication terminals under different fading scenarios, both indoors and outdoors. Some of the features and procedures of the MIMO analyser may be used in industrial microwave heating processes for drying and curing of materials, also known as microwave ovens, allowing a greater efficiency and homogenization in the processes.

7 Claims, 8 Drawing Sheets (56) References Cited

U.S. PATENT DOCUMENTS

| | | | |
|---|---|---|---|
| 3,402,277 A * | 9/1968 | Muller | 219/700 |
| 3,549,848 A * | 12/1970 | Williams | 219/700 |
| 3,564,187 A * | 2/1971 | Smith | 219/699 |
| 3,748,424 A * | 7/1973 | Fitzmayer | 219/737 |
| 4,144,436 A * | 3/1979 | Hauck | 219/751 |
| 4,672,254 A * | 6/1987 | Dolat et al. | 310/313 R |
| 4,752,663 A * | 6/1988 | Meisel | 219/746 |
| 4,880,578 A * | 11/1989 | Holcombe et al. | 264/432 |
| 4,889,965 A * | 12/1989 | Gervais et al. | 219/696 |
| 4,904,837 A * | 2/1990 | Low et al. | 219/717 |
| 4,908,486 A * | 3/1990 | Fry | 219/697 |
| 5,228,947 A * | 7/1993 | Churchland | 156/580.1 |
| 5,341,814 A * | 8/1994 | Van De Velde et al. | 600/549 |
| 5,429,799 A * | 7/1995 | Shieh et al. | 422/21 |
| 5,449,889 A * | 9/1995 | Samardzija | 219/695 |
| 5,487,875 A * | 1/1996 | Suzuki | 422/186.05 |
| 5,624,592 A * | 4/1997 | Paustian | 219/679 |
| 5,656,932 A * | 8/1997 | Kitayoshi | 324/615 |
| 6,111,237 A * | 8/2000 | Paustian | 219/687 |
| 6,558,635 B2 * | 5/2003 | Minaee et al. | 422/186 |
| 6,818,852 B2 * | 11/2004 | Ohmi et al. | 219/121.43 |
| 7,025,280 B2 * | 4/2006 | Kaushal et al. | 236/16 |
| 7,102,354 B2 * | 9/2006 | Ardenkjaer-Larsen et al. | 324/321 |
| 7,109,932 B2 * | 9/2006 | Kadambi et al. | 343/703 |
| 7,122,772 B2 * | 10/2006 | Feher et al. | 219/697 |
| 7,127,358 B2 * | 10/2006 | Yue et al. | 702/30 |
| 7,286,961 B2 | 10/2007 | Kildal | |
| 8,207,479 B2 * | 6/2012 | Ben-Shmuel et al. | 219/746 |
| 2002/0127155 A1 * | 9/2002 | Minaee et al. | 422/186 |
| 2002/0160717 A1 | 10/2002 | Persson et al. | |
| 2003/0184417 A1 * | 10/2003 | Li et al. | 333/227 |
| 2004/0031776 A1 * | 2/2004 | Gevelber et al. | 219/121.36 |
| 2004/0134904 A1 * | 7/2004 | Clemen, Jr. | 219/709 |
| 2004/0183547 A1 | 9/2004 | Kildal | |
| 2006/0017630 A1 | 1/2006 | Kildal | |
| 2006/0081626 A1 * | 4/2006 | Yoshino et al. | 219/756 |
| 2008/0099475 A1 * | 5/2008 | Lee et al. | 219/730 |
| 2009/0303141 A1 | 12/2009 | Kosdikian et al. | |

FOREIGN PATENT DOCUMENTS

| | | |
|---|---|---|
| FR | 2 887 337 | 12/2006 |
| FR | 2906040 A1 | 3/2008 |
| WO | WO 00/34795 | 6/2000 |
| WO | WO-0054365 A1 | 9/2000 |
| WO | WO 02/056041 | 7/2002 |
| WO | WO-2008031964 A2 | 3/2008 |
| WO | WO 2009/039481 | 3/2009 |

* cited by examiner

MULTIPLE INPUT, MULTIPLE OUTPUT ANALYSER

The present application claims priority to Patent Application No. ES P200802584, filed on Sep. 3, 2008, the entire disclosure of which are incorporated herein by reference for all purposes.

FIELD OF INVENTION

Wireless systems with multiple inputs and multiple outputs (MIMO) of the signal turn multipath propagation, initially seen as a problem, into a solution to the limited transmission capacities. In this way, parallel transmission channels are available by increasing the number of transmitting antennas and/or receiving antennas. Thus, high spectrum efficiencies can be achieved over the radio channel, which constitutes a very competent way to satisfy the high requirements of the forthcoming Fourth Generation (4G) mobile communication systems and others beyond. When the transmission channel transports energy instead of information by using high power supplies, other effects such as heating, drying and curing of materials, can be obtained.

BACKGROUND

The MIMO Analyzer is a multimode resonant chamber with high Q factor and a very inhomogeneous spatial distribution of the electric and magnetic fields. It consists of two cavities, typically upper and lower, coupled through a metallic plate with slots or a waveguide, which is made accessible by a shielded door. There are various elements and methods to homogenize the fields such as: mode stirrers, slotted metal elements, the movement of the device under test (DUT) inside the chamber or the use of lenses at the slots. Until now all mode stirrers have been proposed to be built on metallic materials, some of them with special forms, as it can be observed from the WO200054365 document. On the other hand, metallic slotted pieces are described on WO2008031964, restricting their application to the aeronautic industry.

Multimode resonant cavities are used in wireless communications applications for laboratory measurements that emulate those made for mobile terminals in Rayleigh propagation scenarios with isotropic distribution of received power. Among the parameters that can be measured there are: diversity gain, MIMO capacity, antenna efficiency, absorbed power, correlation between antennas, specific absorption rate, antenna sensitivity, bit error rate (BER) probability, (these last two have been claimed in U.S. Pat. No. 7,286,961 for reverberation chambers). Thus, until now measurements could only be made for isotropic Rayleigh-fading environments when employing multimode resonant cavities. Furthermore, it is also possible to perform measurements with different dummies filled with lossy fluid with the aim of observing the energy absorption mechanism and its associated reduction in the radiation efficiency of the device under test. This will in turn resemble the behaviour of the device in the presence of a human being, which allows, for example, the investigation on the effects of a user's head in mobile terminals.

The different existing environments for wireless communications can be modelled by using different probability functions. Two of the most common functions used to model these environments are the Rayleigh and Rician functions, with the K factor. The K factor is a parameter that defines the different types of scenarios in Rician environments. These propagating environments determine the performance of wireless communications systems operating within them. As a general rule, macro-cells have greater Rician K factor than micro-cells, that is, the line of sight (LOS) component is more dominant. Moreover, within the cell the K factor decreases with increasing distance to the transmitter. In contrast, the urban environments and those inside buildings often have a rich multipath scattering, which is important enough to make the direct view be hardly dominant, making the statistical distribution of this environment that of a Rayleigh one. Until now only Rayleigh-fading environments could be emulated with multimode resonant cavities, which is a problem. Therefore, when a proper evaluation of terminals is desired for other types of environments, alternative methods such as cumbersome outdoor measurement campaigns in different places are required. These measurement campaigns are costly both time and money wise.

Another application of multimode resonant cavities is microwave heating, drying and curing, that is, these cavities are useful for all processes that involve high power and high frequency electromagnetic fields which are radiated in order to generate heat in a sample of some material. In a microwave oven the object to be heated up is placed either in a fixed position or in a turntable that rotates in order to blend that heat as much as possible. Depending on the incident electromagnetic fields in the sample, the heating will be more or less efficient. In the document ES 2246183 the procedure to obtain the optimal heating position of the sample in terms of electromagnetic fields is described. The objective is to obtain the highest possible efficiency and the highest heating homogeneity as possible. To be able to achieve that goal, the electromagnetic fields have to concentrate uniformly in the sample. There is a problem, however, since heating efficiency can vary from 20% to 90% depending upon the electromagnetic field distribution with the existing methods. When either the size or the properties of the sample material change, the heating efficiency decreases since there is no possibility to change the electromagnetic fields.

SUMMARY

The MIMO analyzer performs the emulation of the behaviour of terminals with multiple antennas in all types of propagation environments or provides temperature rise of a sample material inside. Therefore, the MIMO analyzer is able to reproduce measurements in both isotropic and non-isotropic environments, as well as to emulate different distributions (Rayleigh, Rician) in a laboratory. Further, the MIMO analyzer is able to transform a measurement environment into another one through a procedure. Therefore, the MIMO analyzer is capable of emulating different propagation environments for multiple-antenna terminals, and can include effects such as the presence of the human head or hand. Likewise, when high-power sources are used, is also able to heat the sample material placed inside up with a specific heat distribution uniformity control.

The MIMO analyzer is a type of multimode resonant chamber which includes several elements and processes in order to perform a dynamic control of the electromagnetic fields in its interior.

Example embodiments disclose a first element included in the MIMO analyser. The first element may be the set of a slotted piece and the pieces that open and close these slots, hereinafter called switching pieces. These elements are able to transform the field distribution from one or more sources or antennas with fixed positions in the upper cavity into a distribution that has different sources switching between active and inactive depending upon the switching pieces opening or closing the slots. Furthermore, the switching pieces can be made of different materials. Should the switching pieces be metallic, the switching function will only have two possible options, on and off, since the signal can either be allowed to flow through the slot or blocked by the metallic piece. When other non-metallic materials are employed to build the switching pieces, the sources could be partially activated. Likewise, the sources can also be partially activated by leaving the slots only partially opened. The partial activation of a source is a novelty that can provide significant advantages when controlling the electromagnetic fields.

Example embodiments disclose a second element in the MIMO analyzer. The second element may be use of mode stirrers made with metallic or with non-metallic materials, or both. In this way, the electromagnetic waves are not only reflected in the metallic stirrers, but also refracted in the non-metallic stirrers. With this kind of stirrers, it is possible to create new electromagnetic disperse modes that can be useful for diverse applications.

Example embodiments disclose a third element in the MIMO analyzer. The third element may be the insertion of lenses between the signal sources and the devices under test, placed at the slots. These lenses are able, for example, to modify the K factor of the emulated environment or to concentrate in a specific way the heat that is absorbed by the sample in a given area.

Example embodiments disclose a fourth element in the MIMO analyzer. The fourth element may be the set of transmitting antennas. These antennas have a special shape that allows them to operate over a wide frequency bandwidth, which enables MIMO analyzer to be used in a large portion of the wireless communications spectrum.

Example embodiments disclose a fifth element in the MIMO analyser. The fifth element may be the introduction of element with losses such as absorbing cones placed in the walls of the multimode lower resonant cavity or liquids with losses arranged at any position. In this way an isotropic environment is transformed into a non-isotropic one and power absorption in the material can be modulated.

Example embodiments disclose a sixth element in the MIMO analyser. The sixth element may be the door. When the door is closed, the door creates an electric wall in the lower cavity. The door can be left partially opened, therefore creating a magnetic wall in the lower cavity. The partial opening of the door in a resonant multimode cavity is a novelty that provides significant advantages when controlling the electromagnetic fields, allowing the existence of modes inside the cavity that reverberate or resonate (resonant modes) within the electric walls of the cavity but also the existence of other modes that try to propagate through the partial aperture in the door (propagation modes).

Example embodiments disclose a first process performed by the MIMO analyzer to implement any of the above six elements independently or in a combination in order to get a particular electromagnetic field distribution in the test zone. This process provides the particular field distribution which is useful for any application.

Example embodiments disclose a second process performed by the MIMO analyzer to locate the devices under test (DUT) outside the lower cavity. The link between the outside and inside part of the lower cavity will be achieved by ether leaving the door partially opened through the use of diverse aperture angles or by using slots with different shapes and sizes that couple the exterior of the chamber with the inner part of the lower cavity. In this way the propagation environment abandons the typical isotropic distribution (which is a uniform distribution of received power in all possible angles of arrival) and will become non-isotropic because the main part of the signal propagates through the partially opened door or the slots in the lower cavity walls.

Example embodiments disclose a third process performed by the MIMO analyzer to evaluate different Rician-fading environments from a single measurement of a Rayleigh-fading distribution, that is, with a single measurement, the MIMO analyzer can emulate the whole range of K factors with the consequent savings in both time and money. With signal processing and an adequate selection of the significant samples of the signal, this sample selection process also allows the evaluation of arbitrary propagating environments from a single Rayleigh-fading measurement.

Example embodiments may be useful in the field of microwave heating, especially in heating, drying and curing of materials. In the following paragraphs the potential use of MIMO analyzer in this field is described.

With the first element, the slotted piece with slots and switching pieces, the electromagnetic field distribution can be made more uniform as well as the radiation efficiency can be maximized according to sample's type of material. Therefore, certain slots will be opened and/or closed depending upon the sample's characteristics, which enables a high efficiency in heating, drying and curing of different materials. This element will therefore increase the microwave applicator versatility, which provides a clear advantage over other designs.

The second element is the use of stirrers made of non-metallic materials. This makes a homogenization in the electromagnetic field possible, as well as minimizes the undesired reflections to sources or magnetrons, that is, the process efficiency is maximized.

The third element, the use of lenses at the slots, allows for a concentration of electromagnetic fields in the sample if using converging lenses, which produces a significant increase in the process efficiency. On the other hand, if diverging lenses are used, there will be a scattering of electromagnetic fields leading to a homogenization of the field in the sample. These lenses will therefore cause a more uniform heating, drying or curing of the sample.

By example embodiments, it is possible to control and modify the electromagnetic fields in the sample, that is, a process similar to what is described in patent ES 2246183 can be developed. The combination of element one with specific positions of the stirrers and the use of one or several lenses of different types can provide an optimum heating efficiency while the electromagnetic field distribution is homogenized over the sample.

DETAILED DESCRIPTION OF EXAMPLE EMBODIMENTS

The following examples help illustrating example embodiments, but they must not be taken as restrictions of its capabilities by any mean.

Example 1

MIMO Analyzer for Wireless Communications

Figure 1:
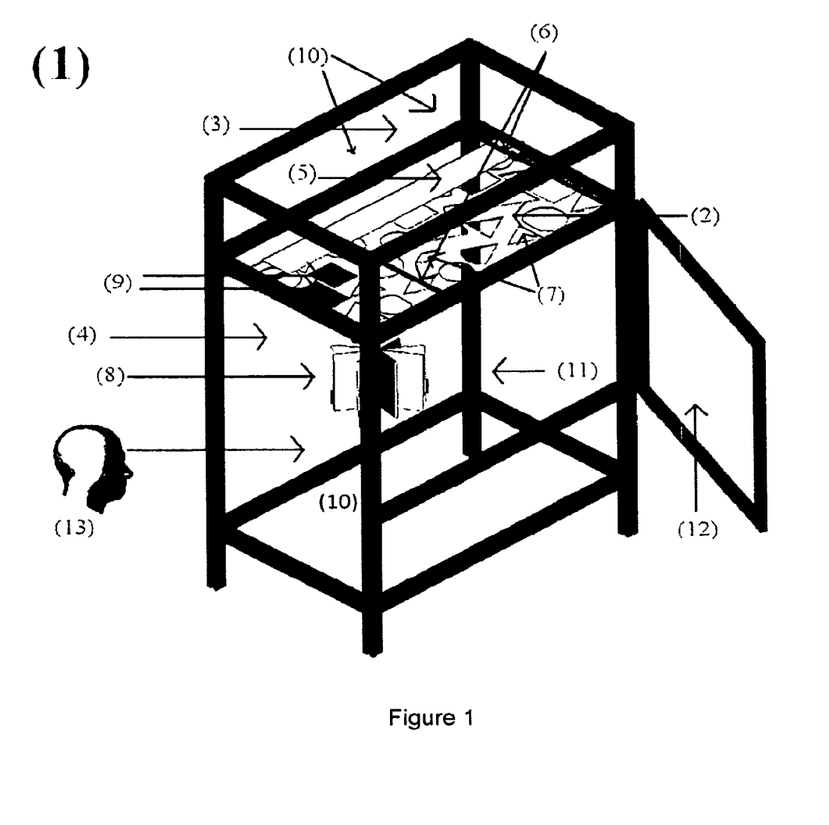
FIG. 1 shows a MIMO analyzer (1) which comprises the following elements: a slotted piece (2) that separates the chamber into two cavities, upper cavity (3) where the transmitter or transmitters are placed and lower cavity (4) where the receiver or receivers are placed, mobile switching pieces (5) with their axles (6) which leave opened or closed various slots (7) of the slotted piece (2), a non-metallic mode stirrer (8), lenses (9) at some slots, and broadband antennas (10). In the figure, the zone where the devices under tests (11) would be located, and the door (12), are also marked. In this zone (11) other elements can also be placed such as a phantom head/hand (13) in order to study the effect of the user.
Figure 2:
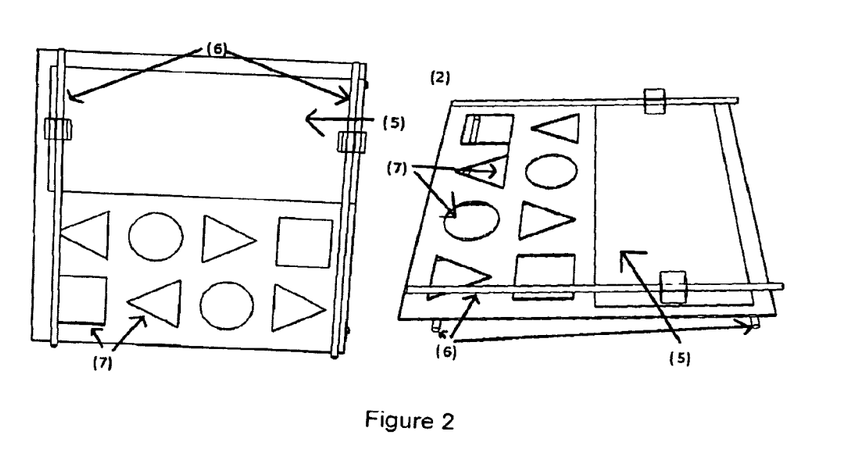
FIG. 2 shows the first element in more detail, that is, the slotted piece (2), the switching pieces (5), one below and one above the slotted piece, made orthogonal to each other, which move and close or open the different slots (7) and the axles (6) through which the switching pieces move.
Figure 3:
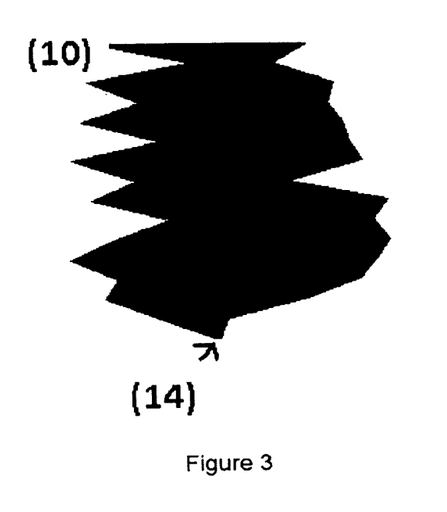
FIG. 3 shows in detail the particular shape of the transmitting elements or antennas (10) of the MIMO analyzer, and their feed point (14).

In an example embodiment, the MIMO analyzer (1), the number of slots (7) in the slotted piece (2) may be 16, which can be opened or closed by the mobile switching pieces (5) located above and below that slotted piece (2). In this MIMO Analyzer (1), there is a circular-shape lens (9) in one of the slots (7). The mode stirrers (8) are located above and below the slotted piece (2). The signal transmission elements (10) are broadband antennas located in the upper part of MIMO Analyzer. Both liquid-filled receptacles and absorbent materials can be introduced in test volume (4), as well as dummies (13) or other elements that emulate human beings. This MIMO analyzer presents the following novelties:

The possibility of emulating Rayleigh-fading environments by the use of a slotted piece (2) with slots that are opened and closed, causing an electric field distribution with that function over the test volume; and by using divergent lenses (9).

The possibility of emulating Rician-fading environments with different K-factors by several techniques: concentrating the direct ray or line of sight (LOS) though a convergent lens; and by the sample selection process that control the electromagnetic fields incidence on the test volume so as to manage the ratio between the direct and reflected rays.

The possibility of emulating non-isotropic environments by different methods: by means of measuring the devices under test outside the chamber and by placing materials with losses inside the lower cavity with the aim of absorbing part of the electromagnetic fields, changing the angle of arrival of the electromagnetic fields incident on the device under test, varying the quality factor (Q) of the collection of employed cavities and allowing the co-existence of different electromagnetic field modes different from the resonant ones.

The possibility of emulating any fading environment, which can be reached by using the process that controls the electromagnetic field distribution over the test volume by an adequate selection of the samples, so that the subset of selected samples statistically behaves in a similar way to the behaviour of the propagating environment that is intended to be emulated and under which the devices are to be measured.

The possibility of emulating Rician-fading environments from Rayleigh-fading environment measurements.

Figure 5:
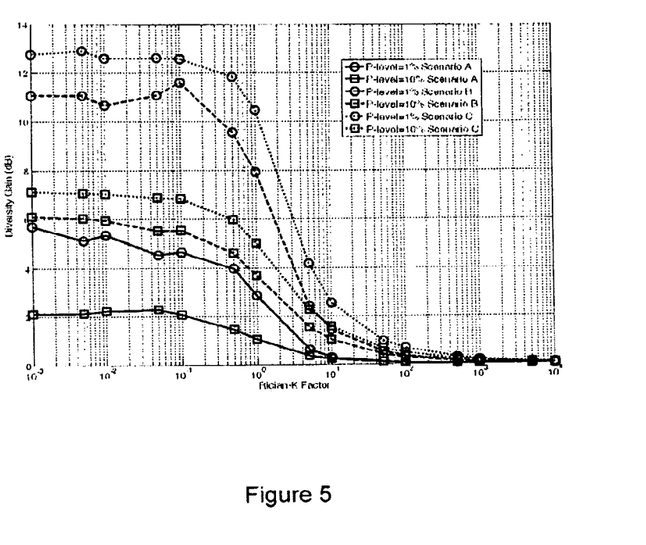
FIG. 5 shows the diversity gain, which is the increase in signal to noise ratio due to having more than one antenna in either transmission or reception, versus the Rician K-factor for some antenna arrays with the probability level as a parameter. This is an example of the performance analyses and evaluation that the MIMO analyzer can perform.
Figure 6:
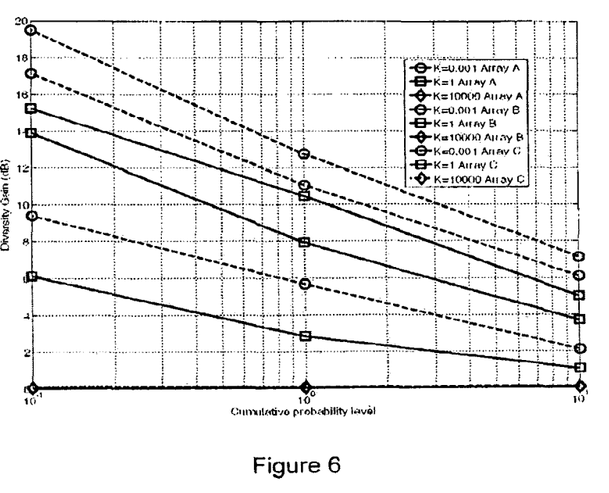
FIG. 6 shows the diversity gain versus cumulative probability level for all different antenna array subsets. This is an example of the performance analyses and evaluation that the MIMO analyzer can perform.

The MIMO Analyzer favourite mode has been designed to be used in the field of wireless communications. This favourite mode allows for an emulation of any of fading environment through different techniques, providing a competitive advantage versus conventional multimode single resonant cavities which can emulate just Rayleigh-fading environments with isotropic distributions of arriving power. As an example, a diversity gain analysis from several three-input and three-output antenna arrays in different Rician-fading environments is shown in FIGS. 5 and 6. The spatial separations between adjacent elements in the diverse arrays are: 0.01 d/$\lambda$ for array A, 0.05 d/$\lambda$ for array B and 0.1 d/$\lambda$ for array C.

The diversity gain analyses of FIGS. 5 and 6 have been performed in the MIMO analyzer favourite mode. FIG. 5 shows the diversity gain versus the Rician K-factor for arrays A, B and C and a cumulative probability ranging from 1% to 10%. From this figure a comparison of performance between arrays can be extracted. For example, for a 1% probability, the diversity gain of array A with K=0.001 (DG=5.8 dB) is equivalent to that of array B with K=2 and that of array C with K=3.5. For a 10% probability, the performance in terms of diversity gain of array B with K=3 is equivalent to that of array C with K=6 (DG=2.2 dB). Another equivalent situation if that of array B with K=0.001 and array C with K=0.8 for a 1% probability. With these comparisons one can extract which factor causes a stronger influence on final diversity gain performance: the propagation environment type or the receive array configuration.

FIG. 6 shows the measured diversity gain versus cumulative probability for several Rician K-factor values and all three measured arrays. On the one hand it is observed that the same results are obtained at K=10000 for all arrays and all values of cumulative probability. A performance comparison for any given value of diversity gain can be performed. For example, if we want to achieve an 8 dB diversity gain in all arrays, the following combinations have to be taken: there is only one option for array A, p=0.18% and K=0.001; there are two options for array B, p=4.1% and K=0.001 or p=1% and K=1; and there are another two options for array C, p=3.5% and K=0.001 or p=6% and K=1. With these comparisons one can extract which factor causes a stronger influence on final diversity gain performance: the probability level at which the comparison are made or the different arrays on their propagating environment type.

As it is well known, the diversity gain depends the array type, the probability level at which it is evaluated and the propagation environment. These three factors have to be combined in an optimum manner by the system designer in order to exploit the available resources at their optimum capabilities. It is for this reason that the MIMO analyzer is a very useful tool for the MIMO system designer in wireless communications applications.

Example 2

MIMO Analyzer for Microwave Heating

Figure 4:
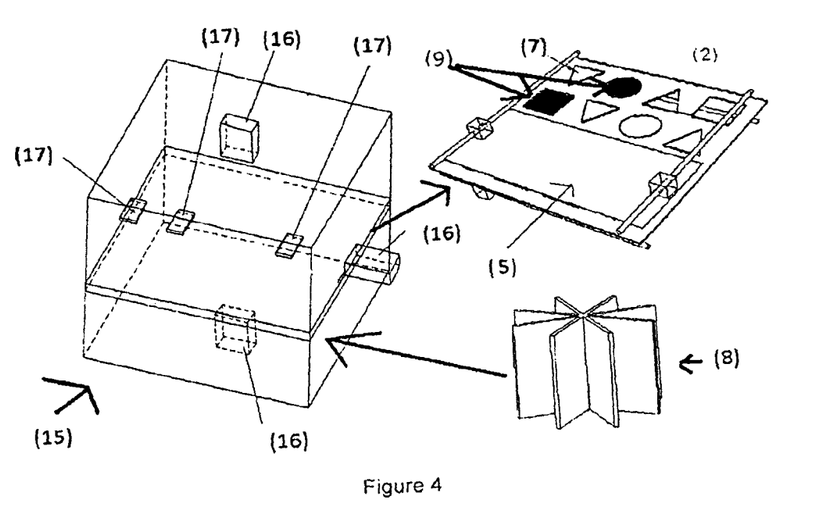
FIG. 4 shows a MIMO analyzer to be employed in microwave heating applications (15) with the following elements: three sources or magnetrons (16), several samples (17), a mode stirrer (8), lenses (9) at some slots and a slotted piece (2).

In a further example embodiment, the use of the MIMO Analyzer's for drying, curing and heating is shown. This example embodiment is based on an applicator (15) equipped with a metallic piece which concentrates the field (2) and maximizes the efficiency, as well as a non-metallic mode stirrer (8) to maximize both efficiency and homogenization of fields on the material under treatment. Depending on the material to be heated, its position and size, some specific slots will be opened in order to achieve, through procedure number one, the above-mentioned objectives of efficiency maximization and heating, drying and curing homogenization. This MIMO analyzer applicator is intended for industrial use and it has the following advantages versus other applicators:

It achieves a maximization of the efficiency, which involves important cost savings.

It provides heating, drying and curing homogenization, which increases the quality of most of the products.

In can be set-up for different materials, which means greater functionality and versatility.

As an example, a homogenization analysis of leather materials with different initial moisture contents and for different power levels of the MIMO analyzer is shown. The different materials had the following initial moisture contents: 1.85 for material 01, 1.81 for material 02, 0.73 for material 03, 0.46 for material 04, 1.40 for material 05, 0.58 for material 06 and 0.32 for material 07.

Figure 7:
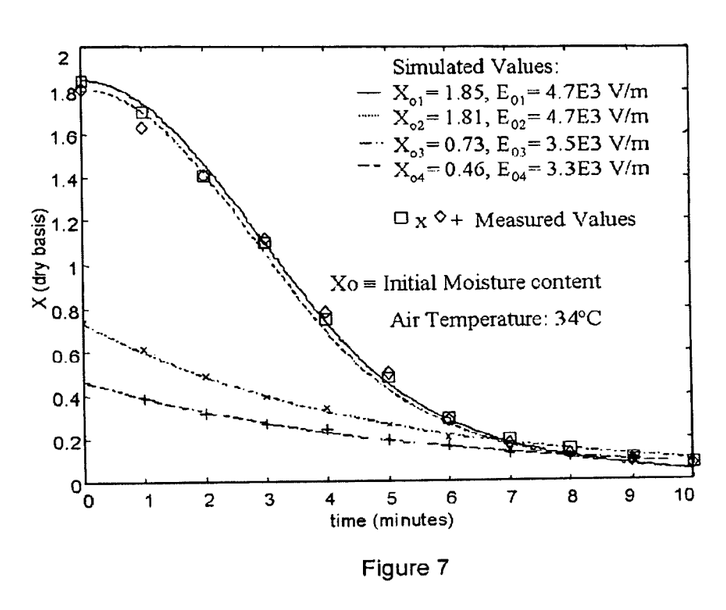
FIG. 7 depicts the drying curve for the moisture content in dry basis versus time for sample materials 01, 02, 03 and 04 with power sources of 700 W.
Figure 8:
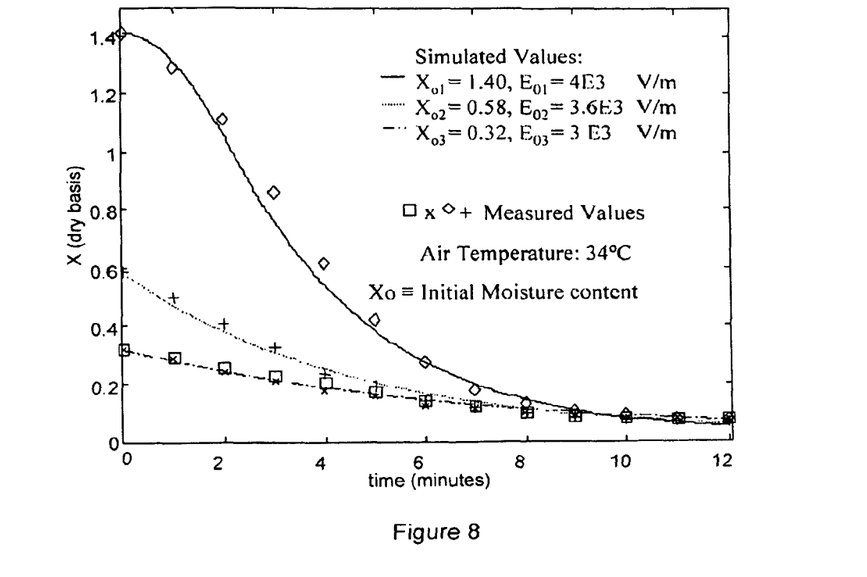
FIG. 8 depicts the drying curve for the moisture content in dry basis versus time for sample materials 05, 06 and 07 with power sources of 540 W.

The homogenization analyses of FIGS. 7 and 8 have been performed by measurements with the MIMO Analyzer in an example embodiment of number two and by simulations. FIG. 7 shows the drying curve for the materials' moisture content on dry basis versus time for materials 01, 02, 03 and 04 and 700 W source power. From this figure, we can conclude that moisture homogenization is completed in only 7 minutes. All materials achieve the same moisture content at that time but at different speeds depending on their initial moisture content. Simulations closely follow measurements.

FIG. 8 shows the drying curve for the materials' moisture content on dry basis versus time for materials 05, 06 and 07 and 540 W source power. In this case, the moisture content homogenization is completed within 10 minutes. Again, all materials achieve the same moisture content but also at different speeds depending on their initial moisture content.

It is well known that microwave drying is strongly influenced by the electromagnetic field distribution on the material, the material's loss factor and its moisture content. These three factors must be combined in an optimal manner by the system designer in order to optimize the use of the available resources. It is for this reason that the MIMO analyzer is a very useful tool for the applicator designer in industrial microwave heating processes.

The invention claimed is:

1. A multiple-input and multiple-output (MIMO) analyzer being of a multimode resonant chamber, comprising:
    a slotted piece that separates the chamber into two cavities, an upper cavity where signal transmission elements are placed and a lower cavity where signal reception elements are placed;
    mobile switching pieces which open or close, totally or partially, slots of the slotted piece, the mobile switching pieces being provided one below and one above the slotted piece;
    axles through which the mobile switching pieces move;
    one or several mode stirrers;
    one or several lenses, the one or several lenses being placed in the slots of the slotted piece;
    one door; and
    one or several broadband antennas
    wherein the slots in the slotted piece have diverse shapes to be opened and closed in order to alter electromagnetic fields in the resonant chamber.

2. The MIMO analyzer according to claim 1, wherein the slotted piece is built on a non-metallic material, so that the electromagnetic fields can only penetrate partially therethrough.

3. The MIMO analyzer system, according to claim 1, wherein some slots can be opened and closed simultaneously, and some slots can remain opened, closed or half-opened, creating in this way higher order electromagnetic modes.

4. The MIMO analyzer system according to claim 1, wherein the mode stirrers are non-metallic, so electromagnetic fields can go partially through the mode stirrers.

5. The MIMO analyzer system according to claim 1, further comprising broadband antennas in the upper and lower cavities.

6. The MIMO analyzer system according to claim 1, further comprising large apertures on two opposite walls of the lower cavity, which provide adequate electromagnetic filtering to avoid leakage, in order to allow a continuous flow of DUTs and permit a continuous compliance testing process.

7. The MIMO analyzer system according to claim 1, wherein the mobile switching pieces, one below and one above the slotted piece, are orthogonal to each other.

* * * * *